United States Patent
Kwon (10) Patent No.: US 7,656,222 B2
(45) Date of Patent: Feb. 2, 2010

(54) INTERNAL VOLTAGE GENERATOR

(75) Inventor: Tae-Heui Kwon, Kyoungki-do (KR)

(73) Assignee: Hynix Semiconductor Inc. (KR)

( * ) Notice: Subject to any disclaimer, the term of this patent is extended or adjusted under 35 U.S.C. 154(b) by 0 days.

(21) Appl. No.: 12/005,958

(22) Filed: Dec. 28, 2007

(65) Prior Publication Data

US 2009/0115380 A1    May 7, 2009

(30) Foreign Application Priority Data

Nov. 5, 2007    (KR) ................ 10-2007-0112036

(51) Int. Cl.
G05F 1/10    (2006.01)
(52) U.S. Cl. .................................... 327/536
(58) Field of Classification Search ............... 327/535, 327/536, 537
See application file for complete search history.

(56) References Cited

U.S. PATENT DOCUMENTS 6,836,176 B2 *    12/2004    Zeng et al. ............... 327/535
7,253,676 B2 *    8/2007    Fukuda et al. ............ 327/536
7,482,856 B2 *    1/2009    Lee ........................ 327/536

FOREIGN PATENT DOCUMENTS

| KR | 1996-0000837 | 1/1996 |
| KR | 10-0858875 | 4/2007 |
| KR | 20070037938 | 4/2007 |
| KR | 10-0858875 | 9/2008 |

* cited by examiner

Primary Examiner—Jeffrey S Zweizig
(74) Attorney, Agent, or Firm—Blakely, Sokoloff, Taylor & Zafman (57) ABSTRACT

An apparatus for generating an internal voltage includes an output-voltage detecting unit for detecting a voltage level of an internal voltage, an oscillating unit for generating a periodic signal in response to a detection signal from the output-voltage level detecting unit, a first driving-voltage level detecting unit for detecting an increase of a voltage level of a driving voltage, a second driving-voltage level detecting unit for detecting a decrease of a voltage level of the driving voltage, a period control unit for controlling a period of the periodic signal in response to output signals of the first and second driving-voltage level detecting units, and a charge pumping unit for generating the internal voltage by charge-pumping the driving voltage in response to an output signal from the period control unit.

20 Claims, 8 Drawing Sheets

INTERNAL VOLTAGE GENERATOR

CROSS-REFERENCES TO RELATED APPLICATION

The present application claims priority to Korean application number 10-2007-0112036, filed on Nov. 5, 2007, which is incorporated by reference in its entirety.

BACKGROUND OF THE INVENTION

The present invention relates to a semiconductor design technology and, more particularly, to an internal voltage generator capable of providing a stable internal voltage for a semiconductor memory device even if an external voltage is unstable.

Generally, an internal voltage generator in a semiconductor memory device is a circuit to generate different internal voltages using an external voltage VDD. This internal voltage generator should generate a stable internal voltage regardless of the changes in temperature, processes or pressure.

Figure 1:
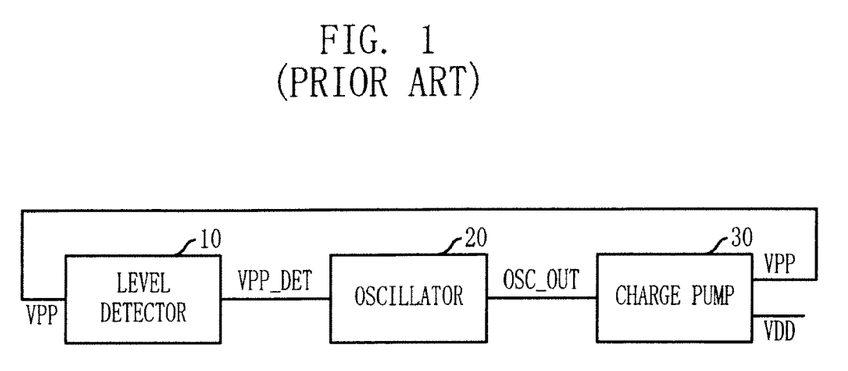
FIG. 1 is a conventional internal voltage generator of a semiconductor memory device.

FIG. 1 is a conventional internal voltage generator of a semiconductor memory device. Referring to FIG. 1, the conventional internal voltage generator includes a level detector 10 to detect a voltage level of a high voltage VPP, an oscillator 20 to produce a periodic signal OSC_OUT in response to a detection signal VPP_DET from the level detector 10, and a charge pump 30 to produce the high voltage VPP, which is higher than an external voltage VDD, by pumping charges from the external voltage VDD.

In the conventional internal voltage generator, a voltage drop in the high voltage VPP is detected by the level detector 10 and the oscillator 20 is then driven to produce the periodic signal OSC_OUT. The charge pump 30 maintains the high voltage VPP at a desired voltage level in response to the period of the periodic signal OSC_OUT.

The high voltage VPP generated as mentioned above is applied to an internal circuit block in the semiconductor memory device. At this time, an amount of current, which is supplied from the charge pump 30, should be larger than that which is consumed in the internal circuit block of the semiconductor memory device. If the amount of current which is consumed in the internal circuit block is larger than that which is supplied from the charge pump 30, a voltage drop in the high voltage VPP causes cell data to not be stored properly in a cell capacitor. Accordingly, the amount of current supplied from the charge pump 30 should be kept larger than that consumed in the internal circuit block.

When the different operations, such as an auto-refresh and a burst write/read operation, are carried out in the semiconductor memory device, a large amount of current consumption occurs in the internal circuit block and this large current consumption of the internal circuit block also causes a voltage drop in the external voltage VDD. That is, in the case where this instant current consumption of the external voltage VDD is excessive, the external voltage VDD undergoes a voltage drop.

As mentioned above, in the case where the external voltage VDD undergoes the voltage drop, since the external voltage, which functions as a driving power, is not sufficiently supplied to the internal circuit block, the high voltage VPP which is produced by pumping charges from the external voltage VDD also undergoes a voltage drop. Therefore, a malfunction can be caused at data read and write operations because of the voltage drop of the high voltage VPP. Furthermore, this voltage drop can be a problem in low-voltage and high-speed semiconductor memory devices, such as a graphic DRAM, which use a low external voltage and operate at high speed. Also, in the case where the external voltage VDD has a high level, the amount of current that needs to be supplied from the charge pump 30 is increased in proportion to the increase of the external voltage VDD. In this case, unnecessary current consumption is caused and an excessive increase of the high voltage VPP may cause an overshooting.

As mentioned above, when the voltage level of the external voltage VDD fluctuates, the amount of current for the high voltage VPP also fluctuates. This makes the actual high voltage VPP insufficient or excessive, which may be illustrated by referring to the following equation 1.

$$Q + I * \Delta t = C * V$$
$$I = C * V / \Delta t \qquad \text{[Equation 1]}$$

As shown in the above equation, the amount of current supplied from the charge pump 30 can be expressed as a function of the external voltage VDD, the capacitance (C) of the charge pump 30 and the time (the period of the periodic signal OSC_OUT, $\Delta t$). Here, the capacity has a constant value which is determined by a circuit designer, but is limited to an appropriate value because a larger capacitor causes an increase in chip size. Further, the periodic signal OSC_OUT of the oscillator 20 has a constant period even if the external voltage VDD is fluctuated (a variation can be caused by skew and temperature changes, but this variation may be ignored).

The amount of current supplied from the charge pump 30 is changed based on the external voltage VDD. For example, even though the external voltage VDD comes from a DC power source, the voltage level of the external voltage VDD can be changed based on the amount of current consumption in the internal operation of the semiconductor memory device. At this time, an amount of current supplied from the charge pump 30 is also changed according to the fluctuation in the voltage level of the external voltage VDD. That is, even if the amount of current consumed in the internal circuit block is constant, the amount of current supplied from the charge pump 30 can be reduced when the external voltage VDD is decreased. Further, when the external voltage VDD is increased, the amount of current supplied from the charge pump 30 is also increased and then the high voltage VPP is increased. As shown in the above equation, the reason why this fluctuation in the voltage level is caused is that the amount of current supplied from the charge pump 30 is in proportion to the voltage level of the external voltage VDD.

Therefore, in case of the conventional internal voltage generator, since the periodic signal OSC_OUT of the oscillator 20 has a constant period regardless of the voltage level of the external voltage VDD, the amount of current supplied from the charge pump 30 can be decreased and the high voltage VPP can undergo the voltage drop. When the high voltage VPP is decreased, the reliability of the cell data, which are stored in memory cells and read out from the cells, deteriorates because the word line to be driven by the high voltage VPP cannot obtain a sufficient voltage level.

Also, when the external voltage VDD is increased, the increase of the high voltage VPP may cause an overshooting because the amount of current supplied from the charge pump 30 is increased.

SUMMARY OF THE INVENTION

The present invention is directed to providing an internal voltage generator capable of generating a stable internal voltage even though an external voltage is unstable.

The internal voltage generator according to the present invention keeps a high voltage stable in spite of a fluctuation in an external voltage, by detecting the fluctuation in a voltage level of the external voltage and then controlling a period of time in a charge pumping operation. Therefore, the reliability of cell data is improved and an overshooting is prevented in the present invention.

BRIEF DESCRIPTION OF THE DRAWINGS

The above and other aspects, features and other advantages of the subject matter of the present disclosure will be more clearly understood from the following detailed description taken in conjunction with the accompanying drawings, in which.

DESCRIPTION OF SPECIFIC EMBODIMENTS

Hereinafter, the present invention will be described in detail through embodiments. The embodiments are just for exemplifying the present invention, and the scope of right to be protected of the present invention is not limited by them.

Figure 2:
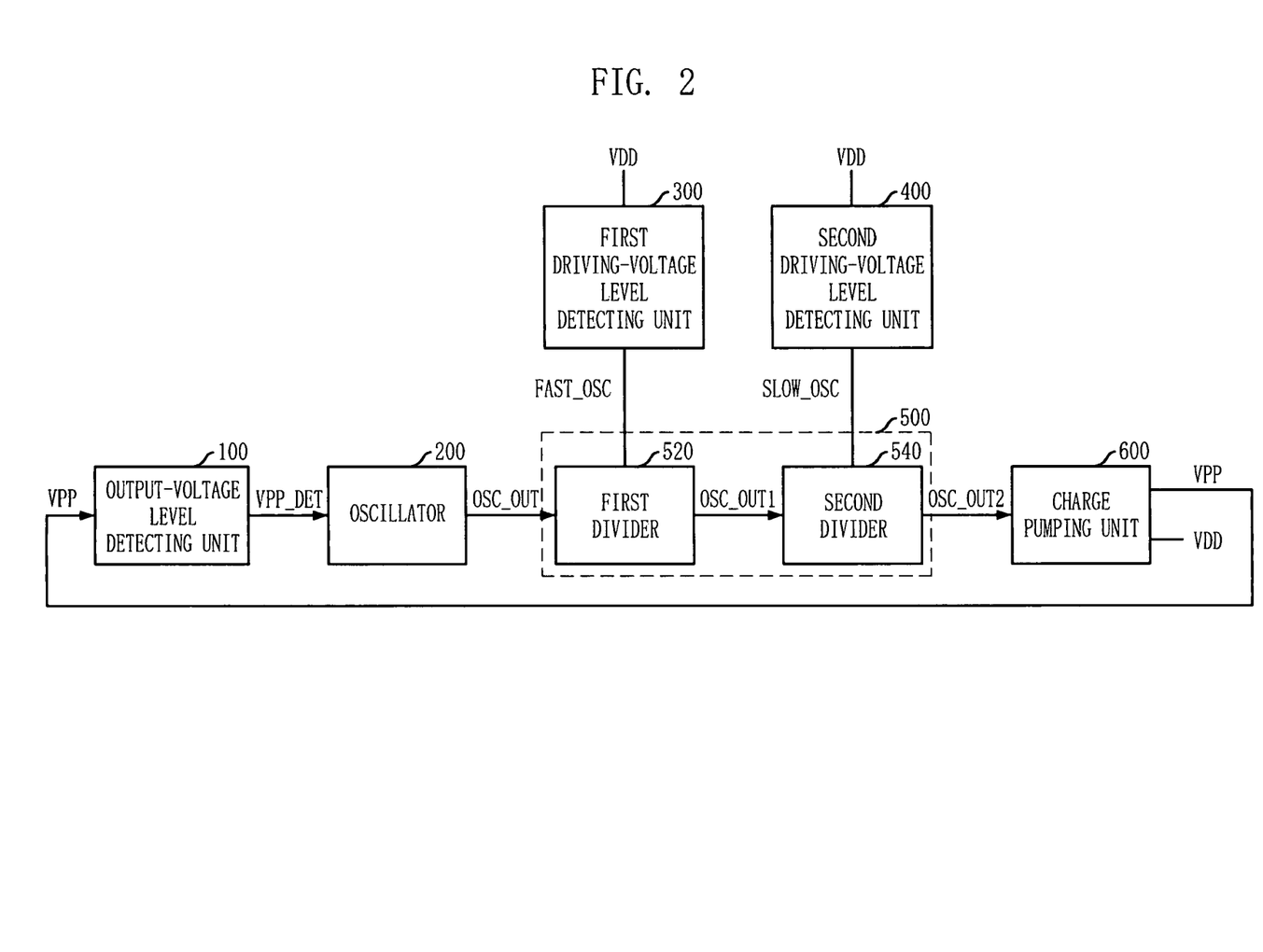
FIG. 2 is a block diagram illustrating an internal voltage generator according to one embodiment of the present invention.

FIG. 2 is a block diagram illustrating an internal voltage generator according to one embodiment of the present invention. Referring to FIG. 1, the internal voltage generator includes an output-voltage level detecting unit 100, an oscillator 200, first and second driving-voltage level detecting units 300 and 400, a period control unit 500 and a charge pumping unit 600. The output-voltage level detecting unit 100 detects a voltage level of a high voltage VPP and the oscillator 200 produces a periodic signal OSC_OUT in response to a detection signal from the output-voltage level detecting unit 100. The first driving-voltage level detecting unit 300 detects a decrease of the external voltage VDD and the second driving-voltage level detecting unit 400 detects an increase of the external voltage VDD. The period control unit 500 controls a period of the periodic signal OSC_OUT in response to output signals FAST_OSC and SLOW_OSC from the first and second driving-voltage level detecting units 300 and 400 and the charge pumping unit 600 pumps the charges from the external voltage VDD in order to produce the high voltage VPP, which is higher than the external voltage VDD, in response to an output signal of the period control unit 500.

For reference, the high voltage VPP is a voltage level which is applied to a gate of a cell transistor and this voltage level should be stable and be higher than the external voltage VDD, which is applied to bit lines, in order to stably read out and write the data. Typically, in case of low-voltage semiconductor memory devices, the external voltage is approximately 1.5V and the high voltage VPP is approximately 3.1.

On the other hand, the charge pumping unit 600 drives the charge pump from the external voltage VDD in response to the output signal of the period control unit 500. In case of the low-voltage semiconductor memory devices, since the target voltage of the high voltage VPP is approximately 3.1, the charge pumping unit 600 should produce the high voltage VPP, which is three times as much as the external voltage VDD, in a tripler type for pumping the charges from the external voltage VDD. The charge pumping unit 600 of the tripler type can produce an ideal voltage level which is correspondent to the high voltage VPP that is three times as much as the external voltage VDD.

In the internal voltage generator according to one embodiment of the present invention, the first and second driving-voltage level detecting units 300 and 400 and the period control unit 500 are further included therein. They detect the decrease and increase of the driving voltage, i.e., the external voltage VDD, and then increase and decrease the period of the periodic signal OSC_OUT according to the detecting results. When the external voltage VDD is increased, the driving number of the charge pumping unit 600 is reduced by increasing the period of the periodic signal OSC_OUT. On the contrary, when the external voltage VDD is decreased, the driving number of the charge pumping unit 600 is increased by decreasing the period of the periodic signal SCO_OUT. Accordingly, the driving number of the charge pumping unit 600 compensates for the fluctuation in the external voltage VDD such that the high voltage VPP is maintained in a constant level.

Figure 3:
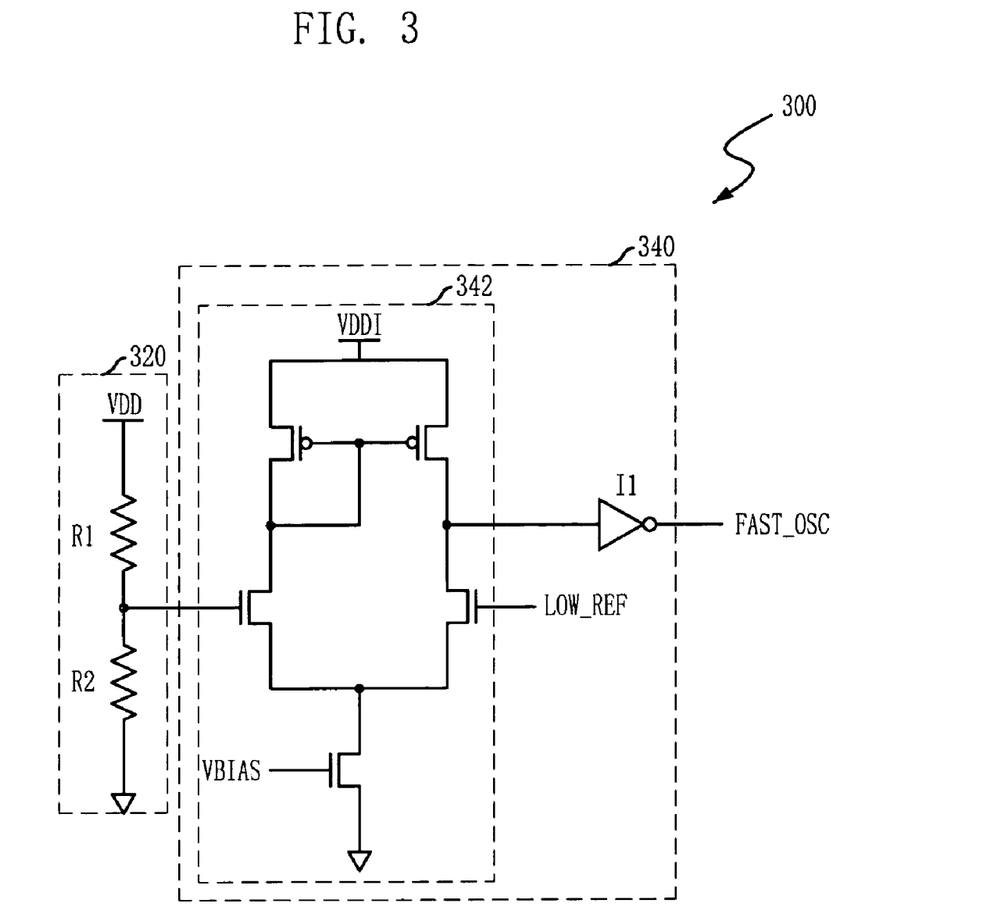
FIG. 3 is a circuit diagram illustrating a first driving-voltage level detecting unit of FIG. 2.

FIG. 3 is a circuit diagram illustrating the first driving-voltage level detecting unit 300 of FIG. 2. Referring to FIG. 3, the first driving-voltage level detecting unit 300 includes a voltage divider 320 for dividing the external voltage VDD (driving voltage) and a first detection signal generating unit 340 for detecting the case where a divided voltage from the voltage divider 320 is lower than a low reference voltage LOW_REF and then outputting a first detection signal FAST_OSC.

The voltage divider 320 includes first and second resistors R1 and R2 for dividing the external voltage VDD and outputs an output voltage, which is applied to a connection node between the first and second resistors R1 and R2, as the divided voltage.

The first detection signalgenerating unit 340 includes a differential amplifier 342 for sensing and amplifying a voltage difference between the low reference voltage LOW_REF and the divided voltage in response to an activation of a bias voltage signal VBIAS and an inverter I1 for outputting the first detection signal FAST_OSC by inverting an output signal of the differential amplifier 342.

The voltage divider 320 outputs the divided voltage by dividing the external voltage VDD. The differential amplifier 342 outputs an output signal of a high level when the divided voltage is higher than the low reference voltage LOW_REF and the inverter I1 inactivates the first detection signal FAST_OSC to a low level by inverting the high level signal from the differential amplifier 342. In the case where the divided voltage is lower than the low reference voltage LOW_REF, a low level signal is outputted from the differential amplifier 342 and the inverter I1 activates the first detection signal FAST_OSC to a high level.

That is, the first driving-voltage level detecting unit 300 activates the first detection signal FAST_OSC to a high level by detecting the case where the divided voltage corresponding to the external voltage VDD is lower than the low reference voltage LOW_REF.

For reference, the low reference voltage LOW_REF having a constant voltage level can be provided by using a bandgap or a Widlar generator. In the case where the first and second resistors R1 and R2 have the same resistance value, the low reference voltage LOW_REF has a half of the external voltage VDD. Therefore, the circuit designer can control the ratio of the first resistor R1 to the second resistor R2 and the voltage level of the low reference voltage LOW_REF can be also adjusted based on the controlled ratio of the first and second resistors R1 and R2.

The bias voltage signal VBIAS is produced by the bandgap and the Widlar generator and has a constant voltage level. The external voltage VDD is used independently to prevent a malfunction of the differential amplifier 342 which is caused by a noise from the external voltage VDD.

Figure 4:
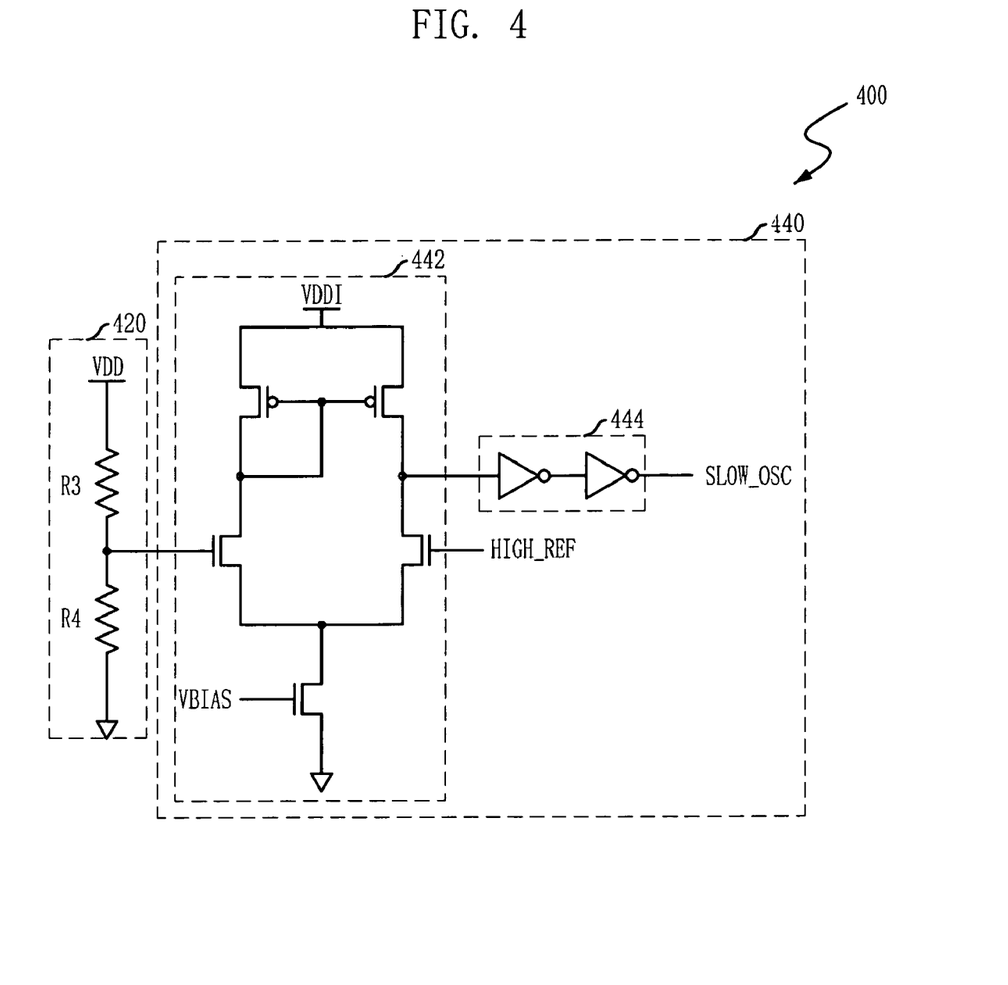
FIG. 4 is a circuit diagram illustrating a second driving-voltage level detecting unit of FIG. 2.

FIG. 4 is a circuit diagram illustrating the second driving-voltage level detecting unit 400. Referring to FIG. 4, the second driving-voltage level detecting unit 400 includes a voltage divider 420 to divide the voltage level of the external voltage VDD and a second detection signalgenerating unit 440 for detecting the case where a divided voltage from the voltage divider 420 is higher than a high reference voltage HIGH_REF and then outputting a second detection signalSLOW_OSC. Preferably, the high reference voltage HIGH_REF is higher than the low reference voltage LOW_REF.

The voltage divider 420 includes third and fourth resistors R3 and R4 which are in series connected to each other and a divided voltage is outputted from a connection nod between the third and fourth resistors R3 and R4.

The second detection signalgenerating unit 440 includes a differential amplifier 442 for sensing and amplifying a voltage difference between the high reference voltage HIGH_REF and the divided voltage in response to an activation of the bias voltage signal VBIAS and a driver 444 for driving an output signal from the differential amplifier 442 and outputting the driving voltage as the second detection signalSLOW_OSC. The driver 444 can include two inverters.

The voltage divider 420 outputs the divided voltage by dividing the external voltage VDD. The differential amplifier 442 outputs an output signal of a high level when the divided voltage is higher than the high reference voltage HIGH_REF and the driver 444 transfers the output signal of the voltage divider 420 such that the second detection signal SLOW_OSC is activated to a high level. In the case where the divided voltage is lower than the high reference voltage HIGH_REF, the differential amplifier 442 outputs the output signal of a low level and the driver 444 activates the second detection signal SLOW_OSC to a low level.

That is, the second driving-voltage level detecting unit 400 detects the case where the divided voltage is higher than the high reference voltage HIGH_REF, thereby activating the second detection signal SLOW_OSC to a high level. Similar to the first and second resistors R1 and R2, the high reference voltage HIGH_REF has a half of the external voltage VDD in the case where the third and fourth resistors R3 and R3 have the same resistance value.

Hereinafter, for convenience in illustration, the external voltage VDD will be illustrated identically to the divided voltage thereof. Accordingly, in the case where the external voltage VDD has a voltage level between the high reference voltage HIGH_REF and the low reference voltage LOW_REF, both the second detection signal SLOW_OSC and the first detection signal FAST_OSC are in a low level.

Figure 5:
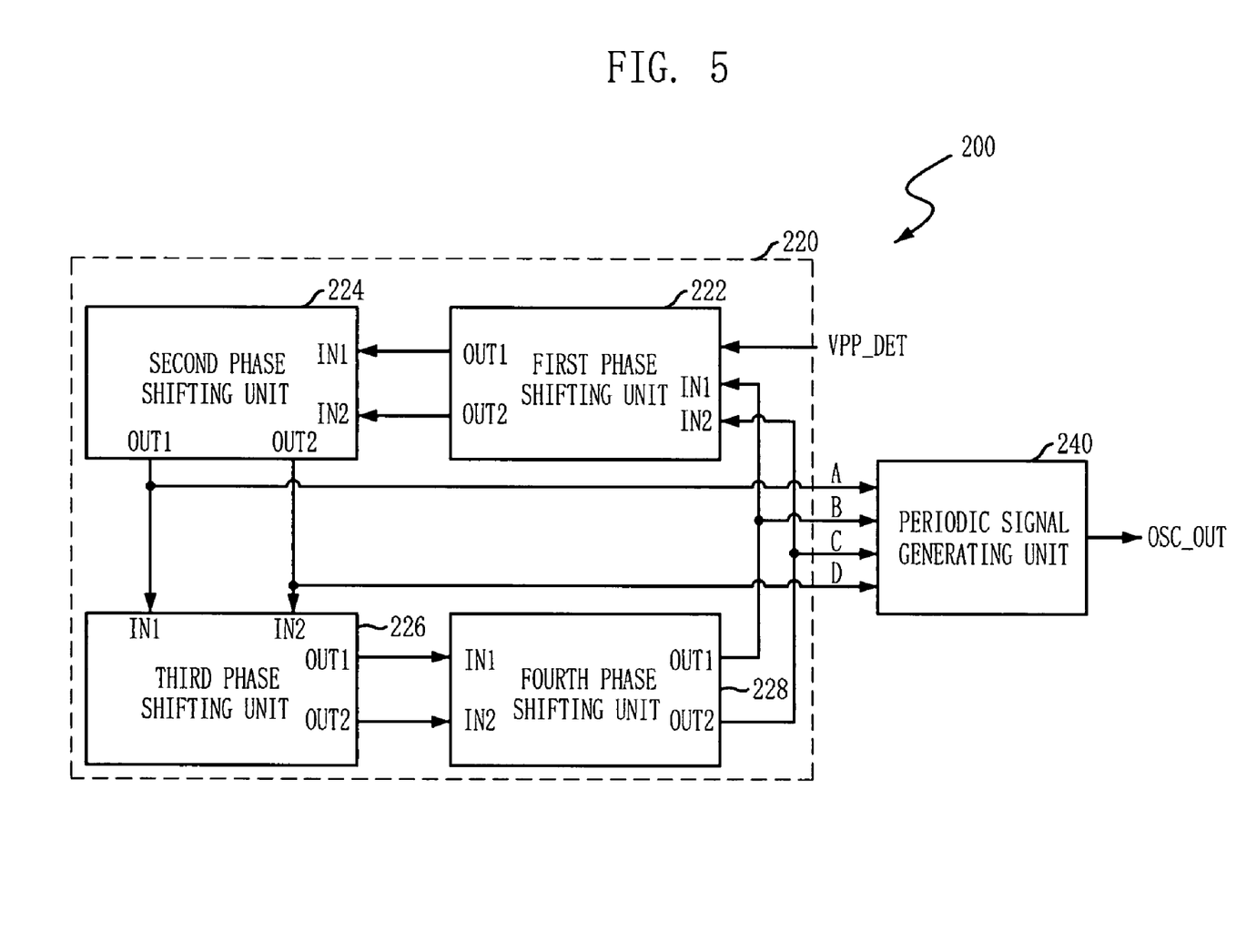
FIG. 5 is a circuit diagram illustrating an oscillator of FIG. 2.

FIG. 5 is a circuit diagram illustrating the oscillator 200 of FIG. 2. Referring to FIG. 5, the oscillator 200 includes a phase signal generating unit 220 to generate first to fourth basic phase signals A, B, C and D, which are out of phase with each other, in response to the detection signal VPP_DET and a periodic signal generating unit 240 to generate the periodic signal by using the first to fourth basic phase signals A, B, C and D.

The phase signal generating unit 220 includes first to fourth phase shifting units 222, 224, 226 and 228. The first phase shifting unit 222 produces positive and negative output signals by shifting the phase of the second and third basic phase signals B and C by 90° in response to the detection signal VPP_DET. The second phase shifting unit 224 produces the first and fourth basic phase signals A and D by shifting the phase of the positive and negative output signals from the first phase shifting unit 222 by 90°. The third phase shifting unit 226 produces positive and negative output signals by shifting the phase of the first and fourth basic phase signals A and D from the second phase shifting unit 224 by 90° and the fourth phase shifting unit 228 produces the second and third basic phase signals B and C by shifting the phase of the positive and negative output signals from the third phase shifting unit 226 by 90°. The second to fourth phase shifting units 224, 226 and 228 have the same configuration. Accordingly, the first and second phase shifting units 222 and 224 and the periodic signal generating unit 240 will be illustrated below.

Figure 6:
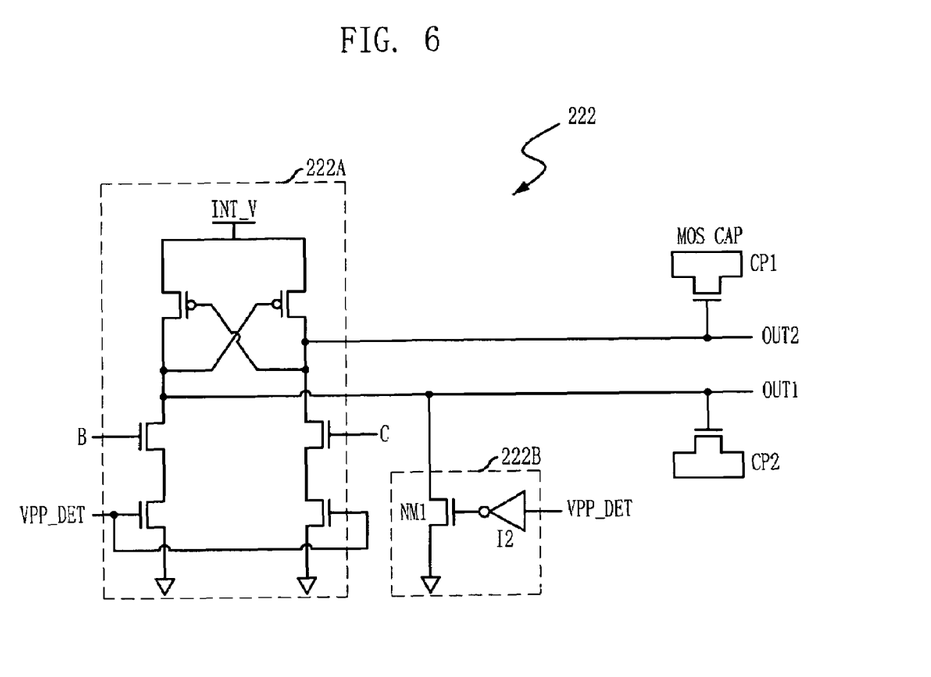
FIG. 6 is a circuit diagram illustrating a first phase shifting unit of FIG. 5.

FIG. 6 is a circuit diagram illustrating the first phase shifting unit 222 of FIG. 5. Referring to FIG. 6, the first phase shifting unit 222 includes a differential amplifier 222A for sensing and amplifying differential inputs of the second and third basic phase signals B and C in response to an activation of the detection signal VPP_DET, first and second capacitors CP1 and CP2 which are respectively connected to first and second output nodes of the differential amplifier 222A, and a driving controller 222B for initializing the first output node in response to the detection signal VPP_DET. In the differential amplifier 222A, a voltage which is applied to the first output node is outputted as a positive output signal OUT1 and a voltage which is applied to the second output node is outputted as a negative output signal OUT2.

The driving controller 222B includes an inverter I2 to invert the detection signal VPP_DET and an NMOS transistor NM1 having a gate to receive an output signal of the inverter I2 and a drain-source path between the first output node and a ground voltage supply terminal.

The driving controller 222B initializes the first output node to a low level when the detection signal VPP_DET is inactivated to a low level. At this time, the second output node is initialized to a high level by the logic level on the first output node.

When the detection signal VPP_DET is activated to a high level, the differential amplifier 222A is enabled and the positive and negative output signals OUT1 and OUT2 are outputted by sensing and amplifying the differential inputs between the second and third basic phase signals B and C. At this time, the positive output signal OUT1 is 90° out of phase with the second basic phase signal B and the negative output signal OUT2 is also 90° out of phase with the third basic phase signal C. That is, the first phase shifting unit 222 produces the positive and negative output signals OUT1 and OUT2 which are 90° out of phase with the second and third basic phase signals B and C in response to the activation of the detection signal VPP_DET, respectively.

Figure 7:
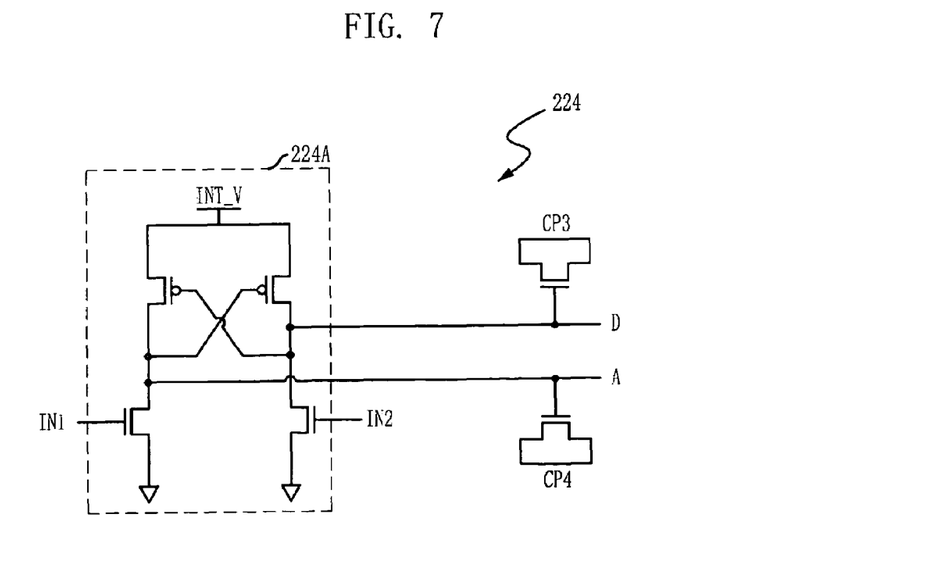
FIG. 7 is a circuit diagram illustrating a second phase shifting unit of FIG. 5.

FIG. 7 is a circuit diagram illustrating the second phase shifting unit 224 of FIG. 5. Referring to FIG. 7, the second phase shifting unit 224 includes a differential amplifier 224A for sensing and amplifying differential inputs N1 and N2, each of which are the positive and negative output signals OUT1 and OUT2 from the first phase shifting unit 222, and third and fourth capacitors CP3 and CP4 which are respectively connected to first and second output nodes of the differential amplifier 224A. Accordingly, in the differential amplifier 224A, a voltage which is applied to a first output node is outputted as the first basic phase signal A and a voltage which is applied to the second output node is outputted as the fourth basic phase signal D.

As compared with the first phase shifting unit 222 of FIG. 6, the first and second phase shifting units 222 and 224 have the same configuration except that the second phase shifting unit 224 does not include the driving controller 222B and the differential amplifier 224A is not controlled by the detection signal VPP_DET. Accordingly, the detailed description of the second phase shifting unit 224 will be omitted.

The differential amplifier 224A receives the positive and negative output signals OUT1 and OUT2 from the first phase shifting unit 222 as the input signals IN1 and IN2 and outputs the first and fourth basic phase signals A and D by sensing and amplifying the voltage difference between the input signals IN1 and IN2. At this time, the first basic phase signal A is 90° out of phase with the positive output signal OUT1 of the second phase shifting unit 224 and the fourth basic phase signal D is also 90° out of phase with the negative output signal OUT2 of the second phase shifting unit 224.

Figure 8:
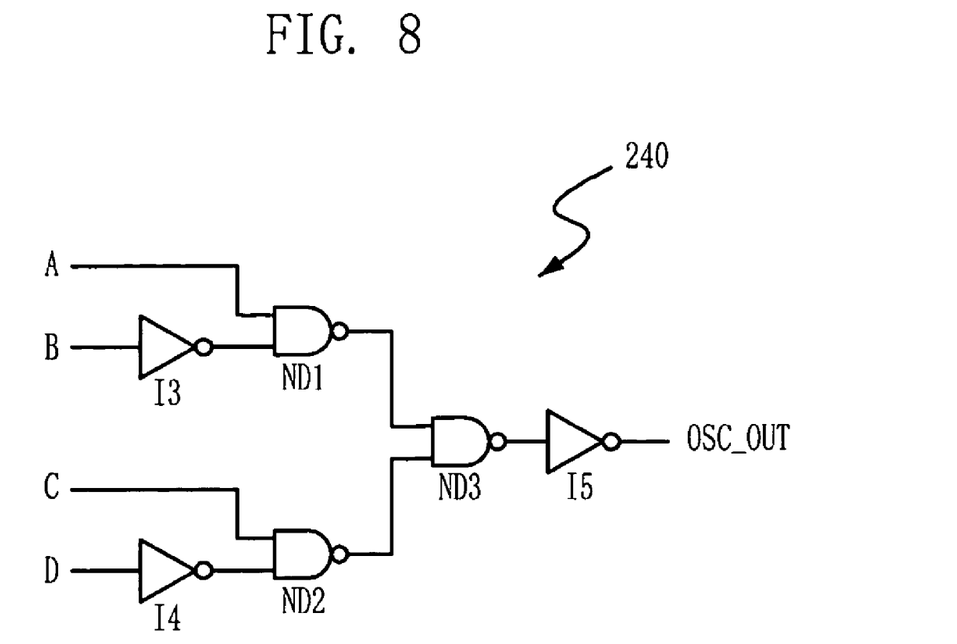
FIG. 8 is a circuit diagram illustrating a periodic signal generating unit of FIG. 5.

FIG. 8 is a circuit diagram illustrating the periodic signal generating unit 240 of FIG. 5. Referring to FIG. 8, the periodic signal generating unit 240 includes inverters I3 to I5 and NAND gates ND1 and ND2. The inverter I3 inverts the second basic phase signal B and the NAND gate ND1 performs a NAND operation of an output signal of the inverter I3 and the first basic phase signal A. The inverter I4 inverts the fourth basic phase signal D and the NAND gate ND2 performs a NAND operation of an output signal of the inverter I4 and the third basic phase signal C. The NAND gate ND3 performs a NAND operation of output signals of the NAND gates ND1 and ND2 and the inverter I5 outputs the periodic signal OSC_OUT by inverting an output signal of the NAND gate ND3.

The periodic signal generating unit 240 receives the first to fourth basic phase signals A, B, C and D and then outputs the periodic signal OSC_OUT which has a half period of the first to fourth basic phase signals A, B, C and D.

As a result, referring to FIGS. 5 to 8, the phase signal generating unit 220 of the oscillator 200 produces the first to fourth basic phase signals A, B, C and D, which are 90° out of phase with each other, in response to the detection signal VPP_DET. The periodic signal generating unit 240, which receives the first to fourth basic phase signals A, B, C and D, outputs the periodic signal OSC_OUT which has a half period of the first to fourth basic phase signals A, B, C and D.

Figure 9:
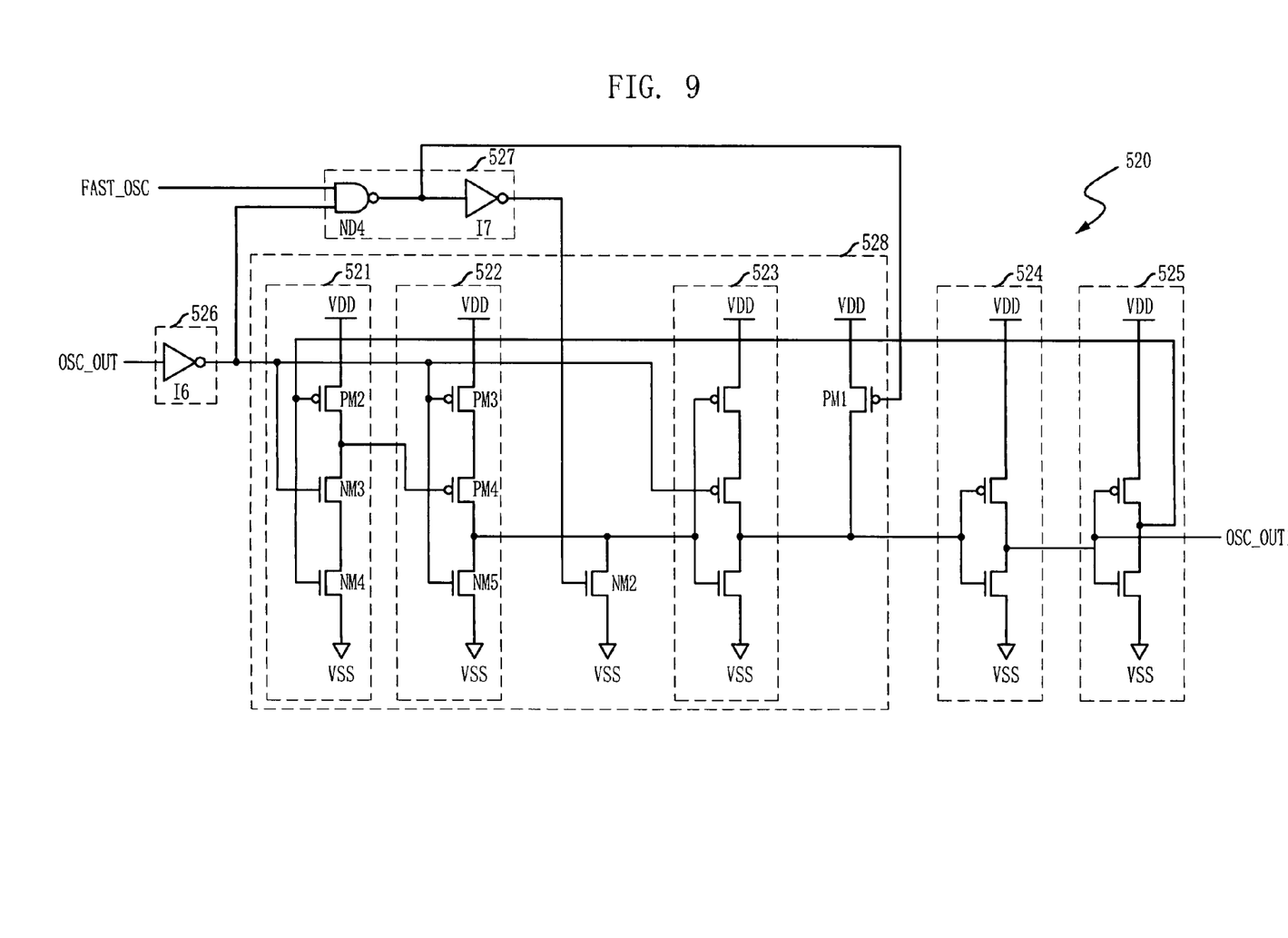
FIG. 9 is a circuit diagram illustrating a first divider in a period control unit of FIG. 2.

FIG. 9 is a circuit diagram illustrating the first divider 520 in the period control unit 500 of FIG. 2. Since the divider 520 has the same configuration as a second divider 540, only the first divider 530 will be described.

Referring to FIG. 9, the first divider 520 includes an input unit 526, a control signal generating unit 527, a period converting unit 528, an output unit 524 and a feedback unit 525. The input unit 526 produces an input signal in response to the periodic signal OSC_OUT and the control signal generating unit 527 produces a driving control signal using the input signal and the first detection signal FAST_OSC. The period converting unit 528 changes, in response to the driving control signal and a feedback signal, the period of the input signal in order that an output signal of the period converting unit 528 has a period twice as much as the input signal or is the same as the input signal without such a change in the period of the input signal. The output unit 524 outputs a first divided signal OSC_OUT1 by inverting an output signal of the period converting unit 528 and the feedback unit 525 outputs the feedback signal to an inverting unit 521 by inverting the first divided signal OSC_OUT1. Here, the input unit 526 includes an inverter I6 which outputs the input signal by inverting the periodic signal OSC_OUT.

The control signal generating unit 527 includes a NAND gate ND4 for outputting a negative driving control signal by using the first detection signal FAST_OSC and the input signal and an inverter I7 for outputting a positive driving control signal by inverting an output signal of the NAND gate ND4.

The period converting unit 528 includes first to third inverting units 521 to 523 and a driving control unit (NM2 and PM1). The first inverting unit 521 inverts an output signal of the feedback unit 525 in response to the input signal. The second inverting unit 522 inverts the input signal in response to an output signal of the first inverting unit 521 and the third inverting unit 523 inverts an output signal of the second inverting unit 522 in response to the input signal. The driving control unit (NM2 and PM1) initializes output nodes of the second and third inverting units 522 and 523 in response to the positive and negative driving control signals, respectively.

The driving control unit includes a PMOS transistor PM1 having a gate to which the negative driving control signal is applied and a source-drain path between a voltage terminal of the external power supply voltage VDD and the output node of the third inverting unit 523 and a NMOS transistor NM2 having a gate to which the positive driving control signal is applied and a drain-source path between the output node of the second inverting unit 522 and the ground voltage supply terminal.

The second inverting unit 522 includes PMOS transistors PM3 and PM4 and an NMOS transistor NM5. The PMOS transistor PM3 has a gate to which the input signal is applied and a source to which the external power supply voltage VDD is applied. The PMOS transistor PM4 has a gate to which the output signal of the first inverting unit 521 is applied and a source-drain path between the drain of the PMOS transistor PM3 and the output node of the second inverting unit 522. The NMOS transistor NM5 has a gate to which the input signal is applied and a source-drain path between the output node of the second inverting unit 522 and the ground voltage supply terminal. The third inverting unit 523 has the same configuration as the first inverting unit 521, except the input signals. Therefore, the detailed description of the third inverting unit 523 will be omitted.

When the first detection signal FAST_OSC is inactivated to a low level, the control signal generating unit 527 inactivates the negative driving control signal to a high level and the positive driving control signal to a low level. The transistors PM1 and NM2 of the driving control unit are turned off in response to the negative and positive driving control signals, respectively.

The input unit 526 inverts the periodic signal OSC_OUT in order to output the input signal. The first inverting unit 521 inverts the output signal of the feedback unit 525 while the input signal is maintained in a high level. The second inverting unit 522 inverts the input signal while the input signal of the first inverting unit 521 is maintained in a low level. The third inverting unit 523 inverts the output signal of the second inverting unit 522 while the input signal is maintained in a low level. By doing so, the period converting unit 528 makes a signal which has a period twice as much as the input signal.

The output unit 524 outputs the first divided signal OSC_OUT1 and the feedback unit 525 outputs the inverted signal of the first divided signal OSC_OUT1 to the first inverting unit 521 as the feedback signal. At this time, the first divided signal OSC_OUT1 has a period twice as much as the periodic signal OSC_OUT.

On the other hand, in the case where the first detection signal FAST_OSC is activated to a high level, the control signal generating unit 527 outputs the negative driving control signal by inverting the input signal and outputs the positive driving control signal by delaying the input signal. The driving control unit (PM1 and NM2) repeatedly performs the turn on/off operations in response to voltage levels of the positive and negative driving control signals. At this time, the first divided signal OSC_OUT1 has the same period as the periodic signal OSC_OUT.

Therefore, the first divider 520 outputs the first divided signal OSC_OUT1, which has a period twice as much as the periodic signal OSC_OUT, in response to a low level signal of the first detection signal FAST_OSC. Also, the first divider 520 outputs the first divided signal OSC_OUT1, which has the same period as the periodic signal OSC_OUT, in response to a high level signal of the first detection signal FAST_OSC.

For reference, the second divider 540 has a configuration similar to the first divider 520; however, there is a difference in the control signal generating unit 527. The control signal generating unit in the second divider 540 includes an inverter to invert the first detection signal SLOW_OSC, a NAND gate to output the positive driving control signal using the input signal and an output signal of the inverter, and an inverter to output the negative driving control signal by inverting an output signal of the NAND gate.

That is, according to the control signal generating unit, the second divider 540 outputs a second divided signal OSC_OUT2, which has a period twice as much as the first divided signal OSC_OUT1, in response to a high level signal of the second detection signal SLOW_OSC. Furthermore, the second divider 540 outputs a second divided signal OSC_OUT2, which has the same period as the first divided signal OSC_OUT1, in response to a low level signal of the second detection signal SLOW_OSC.

The internal voltage generating unit of FIGS. 2 to 9 will be described below in detail.

First, the case 'A' where the external voltage VDD is positioned between the high reference voltage HIGH_REF and the low reference voltage LOW_REF will be described.

The output-voltage level detecting unit 100 activates the detection signal VPP_DET if the high voltage VPP is decreased below a target voltage. The oscillator 200 produces the periodic signal OSC_OUT in response to the detection signal VPP_DET. At this time, the first and second driving-voltage level detecting units 300 and 400 inactivate the first detection signal FAST_OSC and the second detection signal SLOW_OSC to a low level, respectively, in response to the external voltage VDD.

The first divider 520 outputs the first divided signal OSC_OUT1, which has a period twice as much as the periodic signal OSC_OUT, in response to a low level signal of the first detection signal FAST_OSC. Also, the second divider 540 outputs the second divided signal OSC_OUT2, which has the same period as the first divided signal OSC_OUT1, in response to a low level signal of the second detection signal SLOW_OSC. That is, the period control unit 500 outputs the second divided signal OSC_OUT2, which has the same period as the periodic signal OSC_OUT, through the first divider 520. The charge pumping unit 600 produces the high voltage VPP by pumping the charges from the external voltage VDD in response to the period of the second divided signal OSC_OUT2.

On the other hand, the case 'B' where the external voltage VDD is lower than the low reference voltage LOW_REF will be described. For reference, since only both the first and second driving-voltage level detecting units 300 and 400 and the period control unit 500 are changed in the case 'B', the description will be focused on them.

The first driving-voltage level detecting unit 300 activates the first detection signal FAST_OSC to a high level because the external voltage VDD is lower than the low reference voltage LOW_REF. Also, the second driving-voltage level detecting unit 400 inactivates the second detection signal SLOW_OSC to a low level because the external voltage VDD is lower than the high reference voltage HIGH_REF.

Next, the first divider 520 outputs the first divided signal OSC_OUT1, which has the same period as the periodic signal OSC_OUT, in response to a low level signal of the first detection signal FAST_OSC. Also, the second divider 540 outputs the second divided signal OSC_OUT2, which has the same period as the first divided signal OSC_OUT1, in response to a low level signal of the second detection signal SLOW_OSC. That is, the period control unit 500 outputs the second divided signal OSC_OUT2, which has the same period as the periodic signal OSC_OUT, in response to the first detection signal FAST_OSC and the second detection signal SLOW_OSC.

As a result, in the case where the external voltage VDD is lower than the low reference voltage LOW_REF (case 'B'), the period which the second divided signal OSC_OUT2 of the period control unit 500 has is a half period, as compared with the case 'A' where the external voltage VDD is positioned between the high reference voltage HIGH_REF and the low reference voltage LOW_REF. Therefore, the charge pumping unit 600 is more frequently driven in the case 'B' than in the case 'A'.

The present invention detects a decrease of the external voltage VDD by providing the first driving-voltage level detecting unit 300 to detect whether the external voltage VDD is lower than the low reference voltage LOW_REF. Accordingly, if the external voltage VDD is decreased, the output signal of the period control unit 500 has a half period, in order to compensate for the loss of the high voltage VPP. This short period compensates for the loss which is caused by the voltage drop of the external voltage VDD. As shown in equation 1, the period $\Delta t$, which the output signal of the period control unit 500 has, is in inverse proportion to the ability of the current supply and an amount of the supplied current is in proportion to the external voltage VDD.

Finally, the case 'C' where the external voltage VDD is higher than the high reference voltage HIGH_REF will be described. For reference, since only both the first and second driving-voltage level detecting units 300 and 400 and the period control unit 500 are changed in the case 'C', the description will be focused on them.

The second driving-voltage level detecting unit 400 activates the second detection signal SLOW_OSC to a high level because the external voltage VDD is increased more than the high reference voltage HIGH_REF. Also, the first driving-voltage level detecting unit 300 inactivates the first detection signal FAST_OSC to a low level because the external voltage VDD is higher than the low reference voltage LOW_REF.

The first divider 520 outputs the first divided signal OSC_OUT1, which has the period twice as much as the periodic signal OSC_OUT, in response to the low level signal of the first detection signal FAST_OSC. Also, the second divider 540 outputs the second divided signal OSC_OUT2, which has the period twice as much as the first divided signal OSC_OUT1, in response to the high level signal of the second detection signal SLOW_OSC. That is, the period control unit 500 outputs the second divided signal OSC_OUT2, which has the period four times as much as the periodic signal OSC_OUT, in response to the first detection signal FAST_OSC and the second detection signal SLOW_OSC.

As a result, the second divided signal OSC_OUT2 based on the case 'A', in which the external voltage VDD is positioned between the high reference voltage HIGH_REF and the low reference voltage LOW_REF, has a period that is twice as much as in the case 'B' and half as much as in the case 'C'. Accordingly, the driving of the charge pumping unit 600 per unit time is less frequently carried out in the following order of the cases: B (most frequent), A and C (least frequent).

The present invention further includes the second driving-voltage level detecting unit 400 to detect whether the external voltage VDD is higher than the high reference voltage HIGH_REF, thereby detecting the rising of the external voltage VDD. In this case, the period control unit 500 prevents the supplied current from being increased in the charge pumping unit 600, by increasing the period of the periodic signal twice.

Therefore, the internal voltage generating unit according to the present invention controls the fluctuation in the supplied current of the charge pumping unit 600, which is caused by the fluctuation in the external voltage VDD, by using the control of the period of the second divided signal OSC_OUT2. In other words, in the case where the external voltage VDD is lower than the low reference voltage LOW_REF, the driving number of the charge pumping unit 600 is increased by making the period of the driving signal short. Also, in the case where the external voltage VDD is higher than the high reference voltage HIGH_REF, the driving number of the charge pumping unit 600 is decreased by making the period of the driving signal long. That is, the increment or decrement of the supplied current in the charge pumping unit 600, which is caused by the fluctuation in the external voltage VDD, is controlled by the second divided signal OSC_OUT2 through the period control unit 500.

Accordingly, the unnecessary current consumption, which is generated when the supplied current of the charge pumping unit 600 is increased or decreased by the fluctuation in the external voltage VDD, is prevented. Finally, since the current supplied to the charge pumping unit 600 is maintained in a constant level, the high voltage VPP is also stably produced.

On the other hand, in the present invention, the period control unit increases or decreases the period of the periodic signal twice. However, the periodic signal can be changed in various periods. Accordingly, the present invention is not limited to the number of the division of the periodic signal and the dividers may be determined by the number of the division of the periodic signal. For example, in the case where four dividers are provided, the periodic signal can be divided four times to ¼ times.

While the present invention has been described with respect to the particular embodiments, it will be apparent to those skilled in the art that various changes and modifications may be made without departing from the spirit and scope of the invention as defined in the following claims.

What is claimed is:

1. An apparatus for generating an internal voltage comprising:
   an output-voltage level detecting unit for detecting a voltage level of an internal voltage;
   an oscillating unit for generating a periodic signal in response to a detection signal from the output-voltage level detecting unit;
   a first driving-voltage level detecting unit for detecting a decrease in a voltage level of a driving voltage;
   a second driving-voltage level detecting unit for detecting an increase in voltage level of the driving voltage;
   a period control unit for controlling a period of the periodic signal in response to output signals of the first and second driving-voltage level detecting units; and
   a charge pumping unit for generating the internal voltage by charge-pumping the driving voltage in response to an output signal from the period control unit.

2. The apparatus of claim 1, wherein the period control unit decreases the period of the periodic signal in response to the output signal from the first driving-voltage level detecting unit and increases the period of the periodic signal in response to the output signal from the second driving-voltage level detecting unit.

3. The apparatus of claim 1, wherein the period control unit includes:
   a first divider for generating a first divided signal wherein the first divided signal has a first period more than the period of the periodic signal or a second period substantially identical to the period of the periodic signal in response to a first detection signal from the first driving-voltage level detecting unit; and
   a second divider for generating a second divided signal wherein the second divided signal has a second period more than the period of the first divided signal or a second period substantially identical to the period of the first divided signal in response to a second detection signal from the second driving-voltage level detecting unit.

4. The apparatus of claim 3, wherein the first divider includes:
   an input unit for producing an input signal in response to the periodic signal;
   a control signal generating unit for producing a driving control signal using the input signal and the first detection signal;
   a period converting unit for outputting an output signal in response to the driving control signal, the input signal and a feedback signal wherein the output signal has a period shorter than the input signal or is substantially identical to the input signal;
   a divided-signal output unit for outputting the first divided signal in response to the output signal from the period converting unit; and
   a feedback unit for outputting the feedback signal, which is correspondent to the first divided signal, to the period converting unit.

5. The apparatus of claim 4, wherein the input unit includes an inverter for outputting the input signal by inverting the period signal.

6. The apparatus of claim 4, wherein the period converting unit includes:
   a first inverting unit for inverting the feedback signal in response to the input signal;
   a second inverting unit for inverting the input signal in response to an output signal of the first inverting unit;
   a third inverting unit for inverting an output signal of the second inverting unit in response to the input signal; and
   a driving control unit for initializing output nodes of the second and third inverting units in response to the driving control signal.

7. The apparatus of claim 6, wherein the control signal generating unit includes:
- a negative driving control signal output unit for outputting a negative driving control signal in response to the first detection signal and the input signal; and
- a positive driving control signal output unit for outputting a positive driving control signal, wherein the positive driving control signal is out of phase with the negative driving control signal.

8. The apparatus of claim 7, wherein the driving control unit includes:
- a first MOS transistor having a gate to which the negative driving control signal is applied and a source-drain path between a voltage terminal of the driving voltage and the output node of the third inverting unit; and
- a second MOS transistor having a gate to which the positive driving control signal is applied and a drain-source path between a ground voltage supply terminal and the output node of the second inverting unit.

9. The apparatus of claim 3, wherein the second divider includes:
- an input unit for producing an input signal in response to the first divided signal;
- a control signal generating unit for producing a driving control signal using the input signal and the second detection signal;
- a period converting unit for outputting an output signal in response to the driving control signal, the input signal and a feedback signal wherein the output signal has a period longer than the input signal or is substantially identical to the input signal;
- a divided-signal output unit for outputting the second divided signal in response to the output signal from the period converting unit; and
- a feedback unit for outputting the feedback signal, which is correspondent to the second divided signal, to the period converting unit.

10. The apparatus of claim 9, wherein the input unit includes an inverter for outputting the input signal by inverting the first divided signal.

11. The apparatus of claim 9, wherein the period converting unit includes:
- a fourth inverting unit for inverting the feedback signal in response to the input signal;
- a fifth inverting unit for inverting the input signal in response to an output signal of the fourth inverting unit;
- a sixth inverting unit for inverting an output signal of the fifth inverting unit in response to the input signal; and
- a driving control unit for initializing output nodes of the fifth and sixth inverting units in response to the driving control signal.

12. The apparatus of claim 11, wherein the control signal generating unit includes:
- an inverter for inverting the second detection signal;
- a negative driving control signal output unit for outputting a negative driving control signal in response to an output signal of the inverter and the input signal; and
- a positive driving control signal output unit for outputting a positive driving control signal, wherein the positive driving control signal is out of phase with the negative driving control signal.

13. The apparatus of claim 12, wherein the driving control unit includes:

- a third MOS transistor having a gate to which the negative driving control signal is applied and a source-drain path between a voltage terminal of the driving voltage and the output node of the fifth inverting unit; and
- a fourth MOS transistor having a gate to which the positive driving control signal is applied and a drain-source path between a ground voltage supply terminal and the output node of the fourth inverting unit.

14. The apparatus of claim 1, wherein the first driving-voltage level detecting unit includes:
- a first voltage divider for dividing the driving voltage; and
- a detection signal generating unit for outputting a first detection signal by detecting whether the driving voltage is lower than a low reference voltage.

15. The apparatus of claim 14, wherein the first detection signal generating unit includes:
- a first differential amplifier for sensing and amplifying a voltage difference between the low reference voltage and the first divided voltage in response to an activation of a bias voltage; and
- a first output unit for outputting the first detection signal in response to an output signal of the first differential amplifier.

16. The apparatus of claim 14, wherein the second driving-voltage level detecting unit includes:
- a second voltage divider for dividing the driving voltage; and
- a detection signal generating unit for outputting a second detection signal by detecting whether the driving voltage is higher than a high reference voltage.

17. The apparatus of claim 16, wherein the high reference voltage is higher than the low reference voltage.

18. The apparatus of claim 17, wherein the second detection signal generating unit includes:
- a second differential amplifier for sensing and amplifying a voltage difference between the high reference voltage and the second divided voltage in response to an activation of the bias voltage; and
- a second output unit for outputting the second detection signal in response to an output signal of the second differential amplifier.

19. The apparatus of claim 17, wherein the second divided signal, which is produced based on the case where the driving voltage is positioned between the high reference voltage and the low reference voltage, has the period longer than that which is produced based on the case where the driving voltage is lower than the low reference voltage and has the period shorter than that which is produced based on a case where the driving voltage is higher than the high reference voltage.

20. The apparatus of claim 17, wherein the second divided signal, which is produced based on a case where the driving voltage is lower than the low reference voltage, has the period twice as short as that which is produced based on a case where the driving voltage is positioned between the high reference voltage and the low reference voltage and wherein the second divided signal, which is produced based on a case where the driving voltage is higher than the high reference voltage, has the period twice as long as that which is produced based on a case where the driving voltage is positioned between the high reference voltage and the low reference voltage.

* * * * *